United States Patent
Guebre-Tsadik

(10) Patent No.: US 6,655,533 B2
(45) Date of Patent: Dec. 2, 2003

(54) ADJUSTABLE FOUR-COLUMN RACK

(75) Inventor: Anteneh Guebre-Tsadik, Coon Rapids, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 09/967,328

(22) Filed: Sep. 28, 2001

(65) Prior Publication Data

US 2003/0062326 A1 Apr. 3, 2003

(51) Int. Cl.$^7$ .................................................. A47F 5/00
(52) U.S. Cl. ..................... 211/26; 211/175; 211/189; 312/265.1; 312/265.4; 361/829
(58) Field of Search ........................ 211/26, 26.2, 182, 211/191, 175, 190, 189, 195, 204, 201, 202; 361/829; 248/277.1; 312/265.1–265.6, 223.1, 223.2, 223.3

(56) References Cited

U.S. PATENT DOCUMENTS

| | | | | |
|---|---|---|---|---|
| 3,602,373 A | | 8/1971 | Cassel | 211/175 |
| 4,523,722 A | * | 6/1985 | Cohen et al. | 108/102 |
| 4,713,949 A | * | 12/1987 | Wilcox | 108/102 |
| 4,715,502 A | | 12/1987 | Salmon | 211/26 |
| 5,165,770 A | * | 11/1992 | Hahn | 211/26 |
| 5,542,549 A | * | 8/1996 | Siemon et al. | 211/189 |
| 5,556,064 A | * | 9/1996 | Cowe | 211/175 |
| 5,593,046 A | * | 1/1997 | Katsuura et al. | 211/162 |
| 5,938,302 A | * | 8/1999 | Anderson et al. | 312/223.1 |
| 6,017,104 A | | 1/2000 | Foschino | 312/205 |
| 6,019,446 A | * | 2/2000 | Laboch et al. | 211/26 |
| 6,039,420 A | * | 3/2000 | Besserer et al. | 211/189 |
| 6,065,612 A | * | 5/2000 | Rinderer | 211/175 |
| 6,223,908 B1 | | 5/2001 | Kurtsman | 211/26 |
| 6,299,268 B1 | * | 10/2001 | Carle et al. | 312/265.1 |
| 6,419,331 B2 | * | 7/2002 | Wei | 312/140 |
| 6,422,399 B1 | * | 7/2002 | Castillo et al. | 211/175 |
| 6,422,405 B1 | * | 7/2002 | Haenszel | 108/55.1 |
| 2002/0046979 A1 | * | 4/2002 | Larsen et al. | 211/26 |
| 2002/0117462 A1 | * | 8/2002 | Hung | 211/189 |

* cited by examiner

Primary Examiner—Daniel P. Stodola
Assistant Examiner—Jennifer E. Novosad
(74) Attorney, Agent, or Firm—Schwegman, Lundberg, Woessner & Kluth, P.A.

(57) ABSTRACT

A four-column rack including a first rack having a pair of upright columns connected by a first cross-member, a second rack having a pair of upright columns connected by a second cross-member. The first and second racks are connected by an adjustment member. The adjustment member has a first end attached to the first cross-member of the first rack and a second end attached to the second cross-member of the second rack.

21 Claims, 3 Drawing Sheets

ADJUSTABLE FOUR-COLUMN RACK

FIELD OF THE INVENTION

This invention relates to the field of storage devices, and more specifically to a storage rack for electronics equipment.

BACKGROUND

Storage racks and storage cabinets are structures which are used in the electronics industry to provide support for a variety of equipment. For instance, in the telecommunications and data communications industries, one type of rack consists of two upright posts or columns which are connected at top and bottom by cross-bars or cross-connects. The bottom cross-connect usually includes a wider footprint to act as a solid base. The upright columns include a plurality of spaced holes to use for mounting electrical equipment, data equipment, trays, shelves, and so on to the rack.

Lately, the electronics industry is using equipment with a wider variety of sizes. Some equipment needs to be supported at all four corners and four-column racks have been used. U.S. Pat. No. 6,223,908 to Kurtsman discusses a four-column rack which allows for adjusting the depth of the rack. In Kurtsman, each pair of upright columns are connected together with adjustable brackets to allow the depth of the rack to be varied.

However, other features are still needed by users of such four-column racks. For instance, cable management can be a problem. Cables coming from and going to equipment mounted on the rack can become tangled and interfere with use of the rack. Also, the overall rack structure needs to be stable enough to resist twisting of the rack. Another need is the ability of a user to easily construct and install a rack and to gang two or more racks together. Accordingly, what is needed is a depth adjustable rack which allows for easy assembly, gangability, optimal cable management, and high strength and stability.

SUMMARY

The present invention provides an adjustable four-column rack. In one embodiment, a four-column rack includes a first rack and a second rack. Each of the racks include a pair of upright columns which are connected by a cross-member. The first and second racks are connected to each other by an adjustment member which has a first end directly connected to the cross-member of the first rack and a second end directly connected to the cross-member of the second rack. The adjustment member first end and second end are adjustable relative to each other to permit the distance between the first rack and the second rack to be varied.

Among other advantages, the present storage rack provides strength, stability, and improved cable management, while still providing an adjustable solution to allow a user to use the rack for a variety of equipment.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
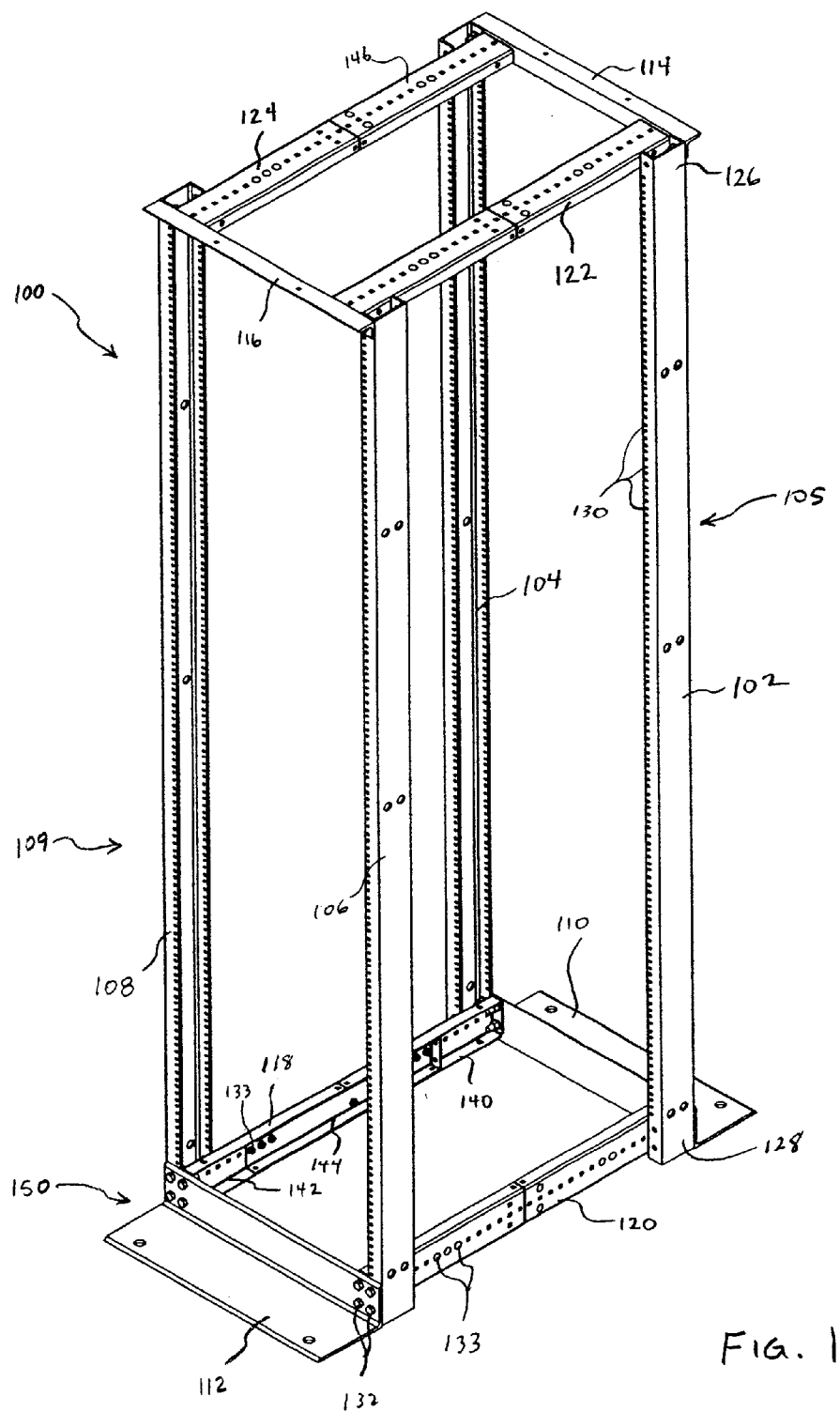
FIG. 1 shows an isometric view of an adjustable four-column rack according to one embodiment.

FIG. 1 shows an adjustable four-column rack 100 according to one embodiment. Four-column rack 100 includes four upright columns or posts 102, 104, 106, and 108. Columns 102 and 104 are connected to each other by a first cross-connect member 110 and a second cross-connect member 114 to form a first frame or rack 105. Likewise, columns 106 and 108 are connected to each other by a first cross-connect member 112 and a second cross-connect member 116 to form a second frame or rack 109. Each of racks 105 and 109 define a plane which is parallel with the other rack. A space between the racks is usable for holding equipment and cables, etc. Racks 105 and 109 are connected to each other via one or more adjustment members 118, 120, 122, and 124. In one example, adjustment members 118–124 include telescoping connecting members which permit the distance between the first rack and the second rack to be varied, while still fixedly connecting the pair of racks 105 and 109 together in a rigid dual rack structure. In one example use of the present rack, each of racks 105 and 109 can have an outer width of 19 inches. Alternatively, the present structure can configured into virtually any width.

Each of posts or columns 102–108 are similar and only column 102 will be described. In this example, column 102 includes an elongated U-channel member extending from a bottom end 128 to a top end 126 and a having a plurality of evenly spaced mounting holes 130 running the length of the column. In other examples, column 102 can be formed from angle bar material, tubular material, or other equivalents. In one embodiment, cross-member 114 is directly attached to top end 126 of column 102 by a conventional bolt or other fastener. Likewise, cross-member 110 is directly attached to bottom end 128 of column 102.

Cross-members 114 and 116 are located proximate the top of columns 102–108. In this embodiment, each top cross-member 114 and 116 includes an angled, L-shaped bracket having a first surface connected to the upright columns and a second surface perpendicular to the first surface. Cross-members 110 and 112 are located proximate the bottom of columns 102–108. Each cross-member 110 and 112 is bolted to the columns by two bolts 132. Each bottom cross-member 110 and 112 includes a L-shaped bracket having a first surface attached to the columns and a second surface perpendicular to the first surface comprising a base portion. In one example, the base portion includes an extended foot section for supporting the four column rack on a floor.

As noted, rack 109 is connected to rack 105 by the depth-adjustment members 118, 120, 122, and 124, thus forming depth adjustable four-column rack 100. Members 118, 120, 122, and 124 allow a user to modify the spacing between racks 105 and 109 as desired. In one example, depending on the depth of the equipment to be mounted on rack 100, the user can change the depth of the rack from approximately 450 mm to approximately 1050 mm inches in depth. In other embodiments, different adjustment members 118–124 having a variety of lengths can be used to provide a wider range of adjustability.

Each of the adjustment members 118–124 are directly attached to respective cross members 110–116 of rack 100. For instance, upper adjustment members 122 and 124 are directly attached to cross members 114 and 116 and located inside the inner dimensions defined by columns 102–108. Lower adjustment members 118 and 120 are attached directly by bolts 132 to cross-members 110 and 112 and also located within the inner dimensions of rack 100. This mounting structure allows for easy construction and modification of the rack since the attachment bolts 132 are exposed on the outside of the rack structure allowing easy access compared with bolts located within the U-channels of column 108, for example. The location of the adjustment members also allows for ease of ganging two or more racks 100. For instance, the location of the adjustment members inside of the upright columns allows a user to gang various racks 100 together without worrying that the bolts will extend too far.

Also, by directly affixing adjustment members 118–124 to the cross members 110–116, the present four-column rack 100 has a sturdy, rigid structure. For instance, in this design a load is evenly distributed at the base and at the top rather than just at the columns. Also, the present design allows for less twisting of the structure, since the base and top are squarely constructed by directly connecting both the columns 102–108 and the adjustment members 118–124 to cross-members 110–116.

Another advantage of the present rack structure is that it allows for ease of assembly. For instance, the base and top sections of the rack can be adjusted without interfering with the columns. As one example, a base section 150 includes base cross-connectors 110 and 112 and adjustment members 118 and 120. Base section 150 can be separated from the upright columns. This allows base section 150 to be independently positioned and adjusted before the rack as a whole is assembled and columns 102–108 are attached. The top section can likewise be constructed and adjusted before being attached to the columns. This allows the base and top sections to be adjusted and positioned without the columns interfering.

Each of adjustment members 118, 120, 122, and 124 are similar in structure, and only adjustment member 118 will be described in detail. Adjustment member 118 includes a first U-channel connecting member 140 directly attached to cross-member 110 and a second U-channel connecting member 142 attached to cross-member 112. An extension member 144 nests within the U-channels and links the first member 140 and the second member 142 together. One or more bolts 133 or other fasteners are used to connect the connecting members to extension member 144. This permits a telescoping or linear adjustment structure between racks 105 and 109. Thus, a user can vary the position of each of the members 142 and 140 relative to extension member 144 to adjust the length of the adjustment member and thereby adjust the depth of rack 100. Some embodiments omit extension members 144, and connecting members 140 and 142 are configured to nest within each other and directly affix to each other. Instead of using U-channel beams, adjustment members 118 and 120 can also be formed from angle brackets, tubular members, or other equivalents.

In one embodiment, upper adjustment members 122 and 124 are mounted in a horizontal orientation. In other words, the widest surface 146 of each U-channel beam is horizontally oriented and the side flanges both point downwards (or upwards). Alternatively, some embodiments mount adjustment members 124 and 122 in a vertical orientation. A horizontal orientation provides for ease of cable management since it makes it easier to support and run cable raceways at the top of the rack, and the weight of the cable raceway will be evenly distributed on the rack without causing any twisting. Also, a horizontal orientation allows for easy accessibility to equipment near the upper portion of the rack since the adjustment member does not interfere.

Figure 2:
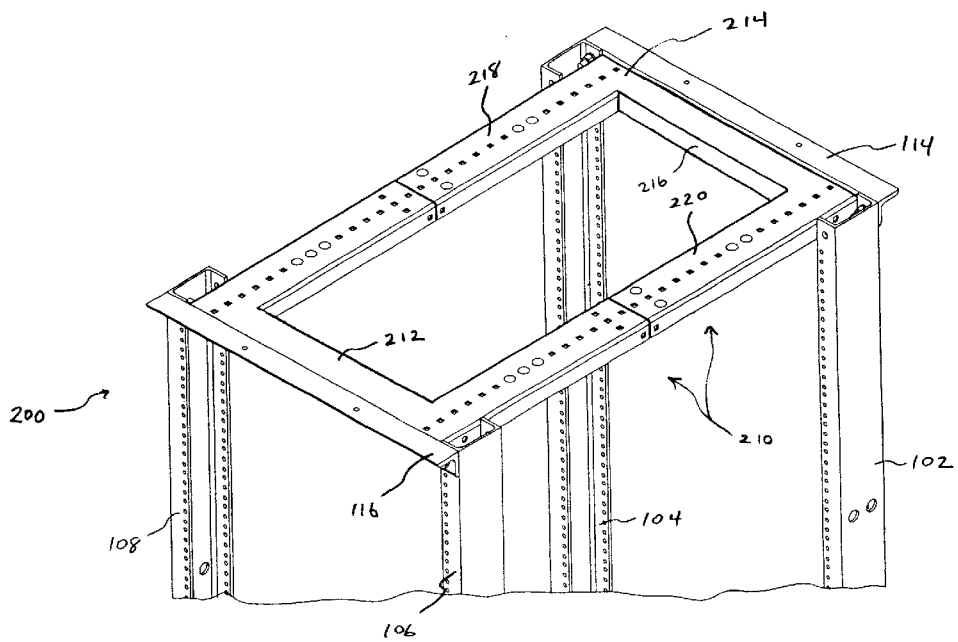
FIG. 2 shows an isometric view of an adjustable four-column rack according to one embodiment.

FIG. 2 shows an isometric view of an upper portion of adjustable four-column rack 200 according to one embodiment. Rack 200 includes similar features as rack 100 and like numbers have been used for like items. Rack 200 includes one or more adjustment members 210 which are directly attached to cross members 114 and 116 of rack 100. In this example, each adjustment member 210 includes a pair of U-shaped members 212 and 214. Each member 212 and 214 includes a pair of connection arms 218 and 220 linked by a back member 216. Member 216 is directly attached to cross-member 114 (and 116). Both the top and bottom portions of rack 200 can include adjustment brackets 210. This provides even further ease of adjustment and assembly since only a pair of members are need for the top and bottom adjustment brackets.

Figure 3:
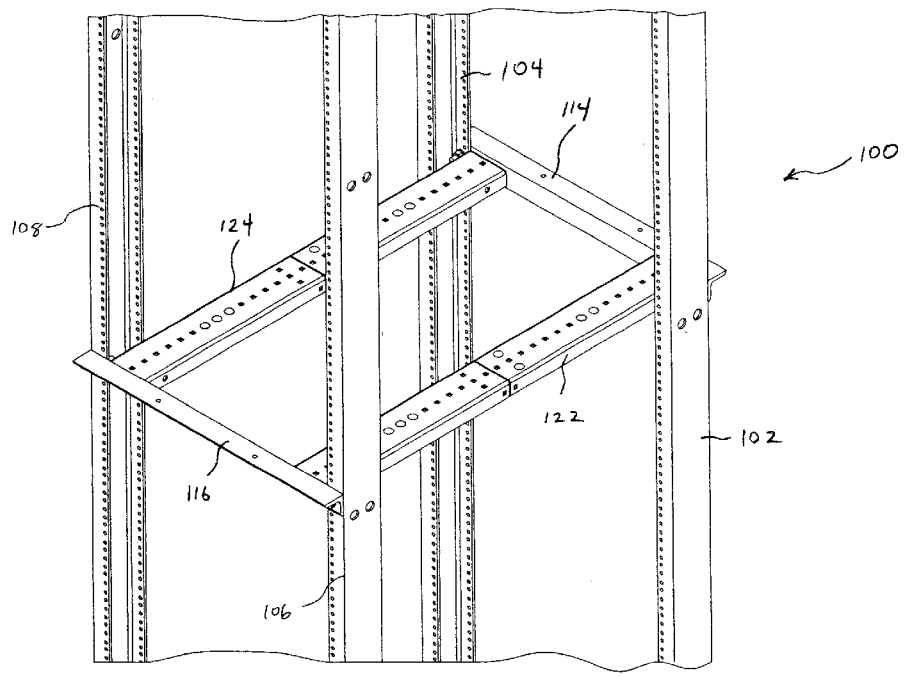
FIG. 3 shows an isometric view of an adjustable four-column rack according to one embodiment.

FIG. 3 shows an isometric view of adjustable four-column rack 100 according to one embodiment. In this example, cross-members 114 and 116 have been mounted on an intermediate portion of each of columns 102–108 instead of near the top. This allows the top of rack 100 to be left open if needed. Other configurations will be apparent to those skilled in the art.

Figure 5:
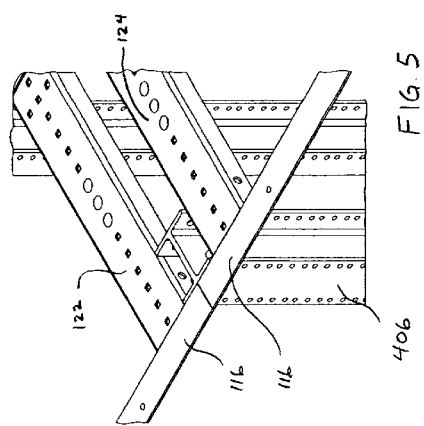
FIG. 5 shows details of a portion of the racks of FIG. 4.
Figure 6:
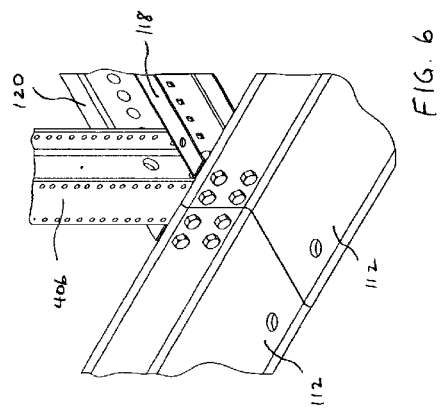
FIG. 6 shows details of another portion of the racks of FIG. 4.
Figure 4:
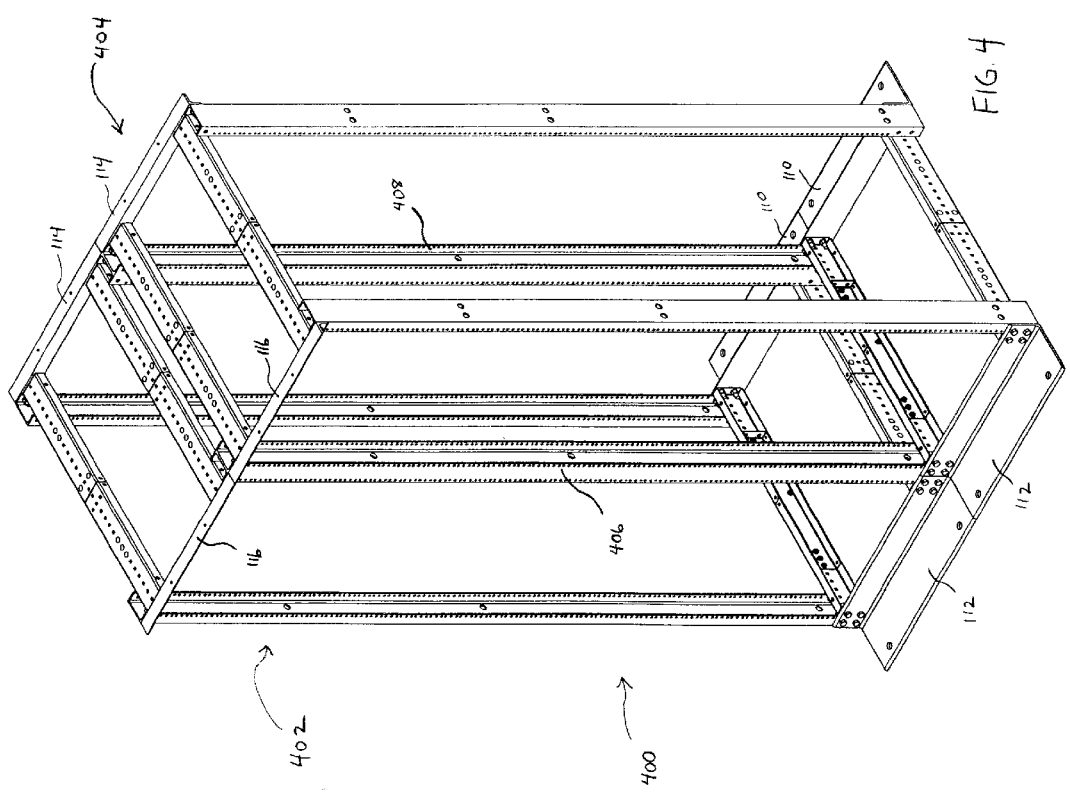
FIG. 4 shows an isometric view of a pair of racks ganged together according to one embodiment.

FIGS. 4–6 show a pair of adjustable racks 402 and 404 ganged together to form a rack structure 400, in accordance with one embodiment. As noted above, a pair of racks 100 as described above in FIG. 1 can be ganged together by attaching columns 102 and 106 of one rack to columns 104 and 108 of a second rack. FIGS. 4–6 show another embodiment for ganging racks together. Most of the structure of rack 400 was described above and will not be repeated in detail. Rack 400 includes a first adjustable rack 402 ganged to a second adjustable rack 404. Each rack 402 and 404 is connected to middle columns 406 and 408. In this example, columns 406 and 408 include H-beam columns. Cross members 110–116 of each of the racks are directly attached to the outer flange of columns 406 and 408. FIGS. 5 and 6 show details of upper cross members 116 attached to column 406 and base cross members 112 attached to column 406. The present system allows a series of racks (2, 3, or more) to be ganged together without an undue burden on the installer. This ganging structure can be used since the adjustment members 118–124 are mounted inside of columns 406 and 408, and. In one embodiment, columns 406 and 408 can have a square-shaped or rectangular shaped cross-section instead of the H-shaped cross-section.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An adjustable four-column rack for supporting equipment, the four-column rack comprising:

a first rack including a first pair of upright columns connected by a first cross-member;

a second rack including a second pair of upright columns connected by a second cross-member, wherein the first rack and the second rack are in parallel planes relative to each other and have a distance therebetween; and an adjustment member connecting the first rack to the second rack, the adjustment member having a first end directly attached to the first cross-member of the first rack and a second end directly attached to the second cross-member of the second rack, wherein the adjustment member first end and second end are adjustable relative to each other to permit the distance between the first rack and the second rack to be varied.

2. The rack of claim 1, wherein each of the first pair of upright columns and the second pair of upright columns are substantially parallel to each other.

3. The rack of claim 1, wherein each of the first pair of upright columns and the second pair of upright columns are substantially parallel to each other and wherein the adjustment member is located within an inside width of the first pair of columns and the second pair of columns.

4. The rack of claim 1, wherein each column of the first pair of upright columns and the second pair of upright columns includes a plurality of mounting holes running along a length of the column.

5. The rack of claim 1, wherein the adjustment member includes a first member directly attached to the first cross-member and a second member directly attached to the second cross-member and an extension member which links the first member to the second member.

6. The rack of claim 1, wherein the adjustment member includes a pair of U-shaped members each having a first section directly attached to one of the cross-members and having a pair of arms extending from the first section.

7. A rack for holding electronic equipment, the rack comprising:

four columns configured into a first pair of columns and a second pair of columns, each of the four columns substantially parallel to each other;

a first base cross-connect member attached to a lower portion of each of the first pair of columns and a second base cross connect member attached to a lower portion of each of the second pair of columns, wherein each of the first base cross-connect member and second base cross-connect member includes a foot section for supporting the rack on a floor;

a first upper cross-connect member attached to an upper portion of the first pair of columns and a second upper cross connect member attached to an upper portion of the second pair of columns;

a first adjustment member extending between and directly affixed to each of the first and second base cross-connect members; and a second adjustment member extending between and directly affixed to each of the first and second upper cross-connect members;

wherein the first and second adjustment members have a variable length to allow the first pair of columns and the second pair of columns to have a variable distance therebetween.

8. The rack of claim 7, wherein the rack includes a third adjustment member extending between and directly affixed to each of the first and second base cross-connect members and a fourth adjustment member extending between and directly affixed to each of the first and second upper cross-connect members.

9. A rack for holding electronic equipment, the rack comprising:

four columns configured into a first pair of columns and a second pair of columns, each of the four columns substantially parallel to each other;

a first base cross-connect member attached to a lower portion of each of the first pair of columns and a second base cross connect member attached to a lower portion of each of the second pair of columns, wherein each of the first base cross-connect member and second base cross-connect member includes a foot section for supporting the rack on a floor;

a first upper cross-connect member attached to an upper portion of the first pair of columns and a second upper cross connect member attached to an upper portion of the second pair of columns;

a first adjustment member extending between and directly affixed to each of the first and second base cross-connect members; and a second adjustment member extending between and directly affixed to each of the first and second upper cross-connect members;

wherein the first and second adjustment members have a variable length to allow the first pair of columns and the second pair of columns to have a variable distance therebetween, wherein the second adjustment member includes a U-channel beam having a wide major surface which is horizontally oriented relative to a floor.

10. A rack for holding electronic equipment, the rack comprising:

four columns configured into a first pair of columns and a second pair of columns, each of the four columns substantially parallel to each other;

a first base cross-connect member attached to a lower portion of each of the first pair of columns and a second base cross connect member attached to a lower portion of each of the second pair of columns, wherein each of the first base cross-connect member and second base cross-connect member includes a foot section for supporting the rack on a floor;

a first upper cross-connect member attached to an upper portion of the first pair of columns and a second upper cross connect member attached to an upper portion of the second pair of columns;

a first adjustment member extending between and directly affixed to each of the first and second base cross-connect members; and a second adjustment member extending between and directly affixed to each of the first and second upper cross-connect members;

wherein the first and second adjustment members have a variable length to allow the first pair of columns and the second pair of columns to have a variable distance therebetween, wherein each of the four upright columns includes a U-channel beam having a plurality of mounting holes running a length of the column.

11. The rack of claim 10, wherein each of the adjustment members includes a first member and a second member and an extension member which links the first member to the second member.

12. The rack of claim 10, wherein each of the adjustment members includes a pair of U-shaped members each having a first section and having a pair of arms extending from the first section.

13. An adjustable rack for supporting equipment, the rack comprising:

a first rack which includes a first pair of upright columns connected to each other at an upper portion of each of the first pair of upright columns by an upper cross-connect bracket and connected to each other at a lower portion of each of the first pair of upright columns by a lower cross-connect bracket, wherein the lower cross-connect bracket includes a foot surface for supporting the first rack on a floor;

a second rack which includes a second pair of upright columns connected to each other at an upper portion of each of the second pair of columns by an upper cross-connect bracket and connected to each other at a lower portion of each of the second pair of columns by a lower cross-connect bracket, wherein the lower cross-connect bracket includes a foot surface for supporting the second rack on a floor;

wherein the first rack and the second rack each define a plane and the first rack plane and the second rack plane are parallel to each other and have a distance therebetween;

a pair of upper adjustment members, each upper adjustment member having a first end directly affixed to the first rack upper cross-connect bracket and a second end directly affixed to the second rack upper cross-connect bracket; and a pair of lower adjustment members, each lower adjustment member having a first end directly affixed to the first rack lower cross-connect bracket and a second end directly affixed to the second rack lower cross-connect bracket;

wherein each of the upper and lower adjustment members includes a telescoping structure such that said first end and second end of each adjustment member are adjustable relative to each other to permit the distance between the first rack and the second rack to be varied.

14. The rack of claim 13, wherein each of the adjustment members includes a first U-channel member and a second U-channel member and an extension member which links the first U-channel member to the second U-channel member.

15. The rack of claim 13, wherein each of the adjustment members includes a pair of U-shaped members each having a first section and having a pair of arms extending from the first section.

16. The rack of claim 13, wherein the pair of upper adjustment members each include a U-channel beam having a wide major surface which is horizontally oriented relative to a floor.

17. An adjustable rack comprising:
a first adjustable rack having a first pair of upright columns; and a second adjustable rack having a second pair of upright columns;

wherein the first adjustable rack and the second adjustable rack are connectable to each other by a pair of central columns, wherein the first pair of upright columns and the second pair of upright columns are each connected to the pair of central columns by one or more cross-members, wherein each of the first and second adjustable racks includes adjustment members extending between a front portion of each rack and a back portion of each rack, wherein each adjustment member is directly attached to each of the one or more cross members.

18. An adjustable four-column rack for supporting equipment, the four-column rack comprising:

a first rack including a first pair of upright columns connected by a first cross-member, each of the first pair of upright columns includes a U-channel beam having a plurality of mounting holes running a length of the column;

a second rack including a second pair of upright columns connected by a second cross-member, each of the second pair of upright columns includes a U-channel beam having a plurality of mounting holes running a length of the column, wherein the first rack and the second rack are in parallel planes relative to each other and have a distance therebetween; and an adjustment member connecting the first rack to the second rack, the adjustment member having a first end directly attached to the first cross-member of the first rack and a second end directly attached to the second cross-member of the second rack, wherein the adjustment member first end and second end are adjustable relative to each other to permit the distance between the first rack and the second rack to be varied.

19. The rack of claim 18, wherein each of the first pair of upright columns and the second pair of upright columns are substantially parallel to each other.

20. The rack of claim 18, wherein the adjustment member includes a first member directly attached to the first cross-member and a second member directly attached to the second cross-member and an extension member which links the first member to the second member.

21. The rack of claim 18, wherein the adjustment member includes a pair of U-shaped members each having a first section directly attached to one of the cross-members and having a pair of arms extending from the first section.

* * * * *